United States Patent
Ross et al.

(10) Patent No.: US 11,109,241 B1
(45) Date of Patent: Aug. 31, 2021

(54) SYSTEMS AND METHODS FOR IMPROVING WIRELESS NETWORK COVERAGE

(71) Applicants: Kevin Ross, Lehi, UT (US); Muhammad Ahsan Naim, South Jordan, UT (US)

(72) Inventors: Kevin Ross, Lehi, UT (US); Muhammad Ahsan Naim, South Jordan, UT (US)

(73) Assignee: L3VEL, LLC, Wilmington, DE (US)

( * ) Notice: Subject to any disclaimer, the term of this patent is extended or adjusted under 35 U.S.C. 154(b) by 0 days.

(21) Appl. No.: 16/746,612

(22) Filed: Jan. 17, 2020

Related U.S. Application Data

(60) Provisional application No. 62/794,334, filed on Jan. 18, 2019.

(51) Int. Cl.
| | |
|---|---|
| H04B 1/44 | (2006.01) |
| H04W 16/14 | (2009.01) |
| H04W 68/02 | (2009.01) |
| H03F 3/195 | (2006.01) |
| H03F 3/21 | (2006.01) |
| H04W 72/12 | (2009.01) |

(Continued)

(52) U.S. Cl.
CPC ............ *H04W 16/14* (2013.01); *H03F 3/195* (2013.01); *H03F 3/211* (2013.01); *H04W 16/18* (2013.01); *H04W 28/24* (2013.01); *H04W 68/02* (2013.01); *H04W 72/1284* (2013.01); *H04W 72/1289* (2013.01); *H03F 2200/294* (2013.01); *H03F 2200/451* (2013.01)

(58) Field of Classification Search
CPC . H04W 72/1289; H04W 68/02; H04W 16/14; H04W 28/0226; H04W 72/1284; H03F 3/195; H03F 2200/451
See application file for complete search history.

(56) References Cited

U.S. PATENT DOCUMENTS

| | | |
|---|---|---|
| 8,385,921 B1 | 2/2013 | Shousterman et al. |
| 8,406,126 B1 | 3/2013 | Leiba et al. |
| 9,425,985 B1 | 8/2016 | Shousterman et al. |

(Continued)

FOREIGN PATENT DOCUMENTS

WO 2018083548 A1 5/2018

*Primary Examiner* — Nhan T Le
(74) *Attorney, Agent, or Firm* — Lee Sullivan Shea & Smith LLP

(57) ABSTRACT

Disclosed herein are improved communication systems and methods for operating in a lightly-licensed, shared frequency spectrum. In one aspect, the disclosed systems and methods may involve a small cell having a coverage area and comprising a radio frequency integrated circuit (RFIC), a switch, an antenna, a power amplifier, and a low noise amplifier (LNA). A receiver RF chain of the small cell may be defined by an interconnection between the antenna, the switch, the LNA, and the RFIC, and a transmitter RF chain of the small cell may be defined by an interconnection between the RFIC, the power amplifier, the switch, and the antenna. In accordance with the present disclosure, the LNA may be configured with at least one parameter that is defined based on an uplink link-budget deficiency associated with a client terminal having a given power class and located at a given location of the coverage area.

20 Claims, 4 Drawing Sheets

(51) Int. Cl.
    *H04W 16/18*    (2009.01)
    *H04W 28/24*    (2009.01)

(56) References Cited

U.S. PATENT DOCUMENTS

| | | |
|---|---|---|
| 9,538,331 B2 | 1/2017 | Ross et al. |
| 9,621,465 B2 | 4/2017 | Ross |
| 9,860,179 B2 | 1/2018 | Ross |
| 9,942,776 B2 | 4/2018 | Ross et al. |
| 9,973,939 B2 | 5/2018 | Ross |
| 10,027,508 B2 | 7/2018 | Leiba et al. |
| D856,962 S | 8/2019 | Hart et al. |
| 10,530,851 B1 | 1/2020 | Hart |
| 10,530,882 B2 | 1/2020 | Ross |
| 2004/0204105 A1* | 10/2004 | Liang ............... H04B 7/0808 455/562.1 |
| 2014/0057570 A1 | 2/2014 | Leiba |
| 2015/0048992 A1* | 2/2015 | Martiskainen ........... H03H 7/38 343/852 |
| 2015/0358082 A1 | 12/2015 | Ross |
| 2018/0331935 A1 | 11/2018 | Ross et al. |
| 2018/0343685 A1 | 11/2018 | Hart et al. |
| 2019/0190563 A1* | 6/2019 | Sakurai ............... H04B 1/0057 |
| 2020/0037238 A1* | 1/2020 | Sundberg ............ H04W 48/20 |
| 2020/0252887 A1* | 8/2020 | Andou ................. H04W 16/28 |

\* cited by examiner

SYSTEMS AND METHODS FOR IMPROVING WIRELESS NETWORK COVERAGE

CROSS-REFERENCE TO RELATED APPLICATIONS

This application claims priority to U.S. Provisional App. No. 62/794,334, filed Jan. 18, 2019, and entitled "METHODS FOR IMPROVING WIRELESS NETWORK COVERAGE," which is incorporated herein by reference in its entirety.

BACKGROUND

Wired and wireless networking and communications systems are widely deployed to provide various types of communication and functional features, including but not limited to those for high speed home internet, security and automation, and/or others. These systems may be capable of supporting communications with a user via a communication connection or a system management action.

One important resource in a communication system is the frequency spectrum that is used to send and receive data between a source and a sink. In previous-generation communication systems (e.g., previous-generation mobile communication systems), a dedicated or licensed frequency spectrum was typically used, where a given portion of the frequency spectrum was allocated to a network operator who obtained exclusive rights to use the given portion in order to build a communication network and provide internet services to various users. Some network operators have resorted to using an unlicensed frequency spectrum that any network operator can use as long as the network operator's equipment radiates power within a maximum allowable limit. However, the unlicensed frequency spectrum typically lacks sufficient quality of service ("QoS"). Thus, there is no guarantee of any service quality on the unlicensed frequency spectrum, and user experience on the unlicensed frequency spectrum degrades as more and more network operators (and users subscribed to a given network operator's internet services) start to operate in the same unlicensed frequency spectrum.

OVERVIEW

A lightly-licensed, shared frequency spectrum is another type of frequency spectrum beyond a licensed or unlicensed frequency spectrum described above. In general, a "shared" frequency spectrum comprises a specific radio frequency band in a specific geographical area that is shared by multiple users (e.g., network operators), and this shared frequency spectrum can be "lightly-licensed," meaning that a portion of the shared frequency spectrum can be licensed on a non-exclusive basis. More recently, the use of a lightly-licensed, shared frequency spectrum has been gaining more traction because it is less expensive than a licensed frequency spectrum and generally offers a better user experience than an unlicensed frequency spectrum, since it requires coordination for its usage.

One example of a lightly-licensed, shared frequency spectrum (which may sometimes be referred to herein as a lightly-licensed frequency spectrum) is the Citizen Broadcast Radio Service ("CBRS") that operates between 3550 Mhz to 3700 Mhz in the U.S. This shared frequency spectrum is typically used by the U.S. Navy, but is also available to other users when it is not needed by the U.S. Navy.

Generally speaking, a portion of the CBRS spectrum a portion of the CBRS spectrum can be licensed on a non-exclusive basis. Usage of the CBRS spectrum is controlled by a central entity known as the Spectrum Access System ("SAS") that allocates spectrum resources to users (e.g., network operators) and ensures a fair sharing of the available spectrum. In particular, the CBRS spectrum is managed and assigned on a dynamic, as-needed basis across 3 tiers of users: (1) Tier 1 for incumbent users, such as the federal government and fixed satellite users, (2) Tier 2 for priority access license ("PAL") users who acquire a portion of the CBRS spectrum through an auction and are required to protect Tier 1 users from harmful interference, and (3) Tier 3 for general authorized access ("GAA") users who will deploy lightly-licensed devices and are required to protect both Tier 1 and Tier 2 users from harmful interference. If the CBRS spectrum is not being used by any tier user, it can be securely accessed by any non-tier user via the SAS without harmful interference.

Further, for the CBRS spectrum, 3 types of communication devices are defined based on an equivalent isotopically radiated power ("EIRP") profile: (1) a category B Citizens Broadband Radio Service Device ("CBSD") that can have a maximum EIRP of 47 dBm per 10 MHz of CBRS spectrum, (2) a category A CBSD that can have a maximum EIRP of 30 dBm per 10 MHz of CBRS spectrum, and (3) an end user device ("EUD") that can have a maximum EIRP of 23 dBm per 10 MHz of CBRS spectrum. The SAS uses radio frequency ("RF") propagation modeling based on the EIRP profile of these three device categories in the CBRS spectrum along with their location, height, and antenna profile to determine a coverage protection zone and analyze harmful interference that may be caused by other devices using the CBRS spectrum in the same location. In practice, a higher EIRP communication device (e.g., a category B CBSD, followed by a category A CBSD) typically has a larger coverage area and requires more processing (e.g., computation) to analyze harmful interference that may be caused by other devices. On the other hand, a relatively-lower EIRP communication device (e.g., an EUD) typically requires less processing (e.g., computation) to analyze harmful interference that may be caused by other devices.

Existing communication systems, especially those that operate in a lightly-licensed frequency spectrum (e.g., the CBRS spectrum), face many challenges. For example, in a lightly-licensed frequency spectrum, for each CBSD (e.g., category A CBSD, category B CBSD), a network operator may be required to pay a SAS provider a certain monthly fee required for maintenance and operation of the SAS that is configured to estimate a coverage and interference profile of the CBSD operating in a region and ensure necessary protection of the CBSD to guarantee a certain minimum QoS, which differentiates the lightly-licensed spectrum from an unlicensed spectrum. As another example, certain user devices operating in the CBRS spectrum may be required to operate as category A or category B CBSDs based on their EIRP profile in order to meet an uplink service quality level. This may cause a substantial increase in operating expenses for a network operator.

Accordingly, disclosed herein are improved communication systems and methods for operating in a lightly-licensed, shared frequency spectrum. For instance, the disclosed systems and methods relate to communication networks that provide broadband internet services to users and operate in a lightly-licensed, shared frequency spectrum.

In general, a communication link (e.g., a wireless mobile communication link between a cell tower and/or station (or small cell) and a mobile terminal, a fixed wireless communication link between a cell tower and/or station (or small cell) and customer premises equipment ("CPE")) may be bi-directional, where "uplink" refers to the flow of traffic from a client terminal (e.g., the mobile terminal or CPE) to a cell tower, and/or station (or small cell) and "downlink" refers to the flow of traffic from the cell tower and/or station (or small cell) to the client terminal. Typically, an uplink service level agreement ("SLA") is less stringent compared to a downlink SLA. For example, in a wireless broadband network, the minimum uplink throughput requirement may be 5-10 Mbps, whereas the minimum downlink throughput requirement may be 50-100 Mbps. However, in some instances, SLA requirements for a network may be the same for both uplink and downlink.

In accordance with the present disclosure, an uplink throughput may refer to a peak throughput that can be achieved using the maximum power available at a client terminal (e.g., the mobile terminal or CPE), and a downlink throughput may refer to a peak throughput that can be achieved using the maximum power available at a small cell (or cell tower and/or station). However, it should be understood that both uplink throughput and downlink throughput may refer to a throughput other than a peak throughput.

In practice, the same antenna may be used in communication devices for both uplink and downlink. For example, for frequency division duplexing ("FDD"), separate frequencies are used for uplink and downlink, but the same antenna may be used in parallel for reception and transmission, assuming there is enough frequency separation between uplink and downlink frequencies. As another example, for time division duplexing ("TDD"), the same frequency may be used for both uplink and downlink, but uplink and downlink operations may take place at different times using the same antenna (e.g., using the antenna for transmission at a given time and using the same antenna for reception at another given time). In this respect, for communication devices, the same antenna gain may be applicable for both uplink and downlink.

Further, in practice, downlink data originating from a cell tower and/or station that includes dedicated power supplies may have higher power levels. In contrast, uplink data that may originate from a client terminal (e.g., a mobile terminal) may be transmitted with a lower power level, and typically the total EIRP may be limited to 23 dBm due to cost and safety reasons. For a client terminal such as CPE, higher power may be used given that CPE are typically powered via a power line from a household or a building. However, an increase in transmission power beyond 23 dBm per 10 Mhz of a given frequency spectrum (especially in case of a lightly-licensed CBRS spectrum) can make CPE a category A or category B CBSD, which may result in a network operator paying a monthly fee to a SAS operator. Accordingly, a network operator using a lightly-licensed spectrum (e.g., the CBRS spectrum) typically has two options: (1) to operate with lower-powered communication devices that may not meet an uplink SLA (especially at a cell edge) or may not be close to a cell tower and/or station or (2) to use high-powered communication devices that meet the required SLA but at the cost of higher operating expenses from SAS fee requirements.

In accordance with the present disclosure, uplink performance of a communication device (e.g., a small cell) that comprises a transmitter radio frequency ("RF") chain and a receiver RF chain can be improved without changing the EIRP profile or power class of the communication device by either introducing a low noise amplifier ("LNA") in the receiver RF chain or modifying one or more parameters of an existing LNA in the receiver RF chain. The one or more parameters of the existing LNA in the receiver RF chain may be modified by adjusting the gain and/or noise figure of the existing LNA such that the overall receiver sensitivity of the receiver RF chain is improved. Since the only change being made in the communication device (e.g., a small cell) is the one or more parameters of the existing LNA in the receiver RF chain (e.g., the gain and/or noise figure of the existing LNA), the EIRP of the communication device, which defines the power class of the communication device, remains the same. As a result, receiver sensitivity may be improved, and a network operator may reduce or possibly eliminate requirements for higher power class client terminals (e.g., CPE) for its communication network, which may reduce operating expenses (e.g., from savings in SAS fees). Further, due to improved receiver sensitivity, lower power class client terminals (e.g., CPE, mobile terminal, or the like) may maintain their uplink SLA for the most part and may also experience improved uplink user experience.

The disclosed process for improving operations in a lightly-licensed frequency spectrum with an LNA may take various forms. As one possibility, the disclosed process may begin with defining parameters for a transmitter RF chain of the communication device (e.g., small cell). Generally speaking, the transmitter RF chain of the communication device (e.g., small cell) may be defined by an interconnection between a radio frequency integrated circuit ("RFIC"), a power amplifier, a switch, one or more filters (e.g., a band pass filter), and an antenna for the communication device. The signals that are carried through the transmitter RF chain of the communication device (e.g., small cell) and received by a client terminal (e.g., CPE, mobile terminal, etc.) may be referred to herein as "downlink signals."

To define parameters for the transmitter RF chain of the communication device (e.g., small cell), a power class for the communication device (e.g., small cell) may be defined. Generally speaking, the power class for the small cell may represent a given EIRP class for the small cell that is available in the lightly-licensed frequency spectrum and can provide sufficient downlink coverage to meet a downlink SLA while keeping SAS fees to a minimum (thereby reducing operating expenses for a network operator). The power class for the small cell may be defined in various manners described in more detail below.

Based on the defined power class for the communication device (e.g., small cell) and perhaps one or more other factors described in more detail below, one or more parameters of an antenna (e.g., antenna gain) for the communication device (e.g., small cell) may be defined. Further, based at least on the defined power class for the small cell and the defined one or more parameters of the antenna (e.g., antenna gain), a conducted power of a power amplifier for the small cell may also be defined. In one embodiment, the conducted power of the power amplifier may represent the difference between the defined power class for the small cell and the antenna gain of the antenna.

After defining the parameters for the transmitter RF chain of the communication device (e.g., small cell), the disclosed process may involve defining parameters for a receiver RF chain of the communication device (e.g., small cell). Generally speaking, the receiver RF chain of the communication device (e.g., small cell) may be defined by an interconnection between the antenna, the switch, an LNA, and the RFIC for the communication device (e.g., small cell). The signals received from a client terminal (e.g., CPE, mobile terminal, etc.) and carried through the receiver RF chain of the communication device (e.g., small cell) may be referred to herein as "uplink signals."

To define parameters for the receiver RF chain of the communication device (e.g., small cell), the disclosed process may involve selecting a power class for a client terminal (e.g., a CPE, mobile terminal, etc.), which may be selected in various manners described in more detail below. Based on the selected power class for the client terminal and perhaps one or more other factors described in more detail below, one or more parameters of an antenna (e.g., antenna gain) for the client terminal may be defined.

Further, a given location in the coverage area of the small cell may be identified. For instance, a given location in the coverage area that is expected to have a signal strength that is at or near the lowest signal strength within the coverage area of the small cell may be identified. In some instances, this given location may be at or near an edge (e.g., a boundary) of the coverage area.

In turn, an uplink link-budget deficiency associated with the client terminal having the selected power class and located at the given location of the coverage area of the small cell may be determined, and an LNA may be added to the receiver RF chain of the small cell or one or more parameters of an existing LNA (e.g., the gain and/or noise figure of the existing LNA) may be tuned, such that the overall receiver sensitivity of the small cell may be improved. For instance, the overall receiver sensitivity of the small cell may be improved by at least the determined uplink link-budget deficiency.

Accordingly, in one aspect, disclosed herein is a small cell having a coverage area, the small cell including (1) a radio frequency integrated circuit ("RFIC"), (2) a switch configured to separate uplink signals and downlink signals, (3) an antenna configured to send uplink signals to the switch and receive downlink signals from the switch, (4) a power amplifier configured to receive a downlink signal from the RFIC and send the downlink signal to the switch, and (5) an LNA configured to receive an uplink signal from the switch and send the uplink signal to the RFIC. A receiver RF chain of the small cell may be defined by an interconnection between the antenna, the switch, the LNA, and the RFIC, and a transmitter RF chain of the small cell may be defined by an interconnection between the RFIC, the power amplifier, the switch, and the antenna. Further, the LNA may be configured with at least one parameter that is defined based on an uplink link-budget deficiency associated with a client terminal having a given power class and located at a given location of the coverage area.

In another aspect, disclosed herein is a communication system that includes one or more client terminals and small cell described above.

In yet another aspect, disclosed herein is a method for defining parameters for the small cell that includes (1) a radio frequency integrated circuit ("RFIC"), (2) a switch configured to separate uplink signals and downlink signals, (3) an antenna configured to send uplink signals to the switch and receive downlink signals from the switch, (4) a power amplifier configured to receive a downlink signal from the RFIC and send the downlink signal to the switch, and (5) an LNA configured to receive an uplink signal from the switch and send the uplink signal to the RFIC. The method may involve (1) defining a power class for the small cell, (2) based at least on the defined power class for the small cell, defining an antenna gain for the antenna of the small cell, (3) determining an uplink link-budget deficiency associated with a client terminal having a given power class and located at a given location of a coverage area of the small cell, and (4) based on the determined uplink link-budget deficiency, defining one or more parameters of the LNA of the small cell.

One of ordinary skill in the art will appreciate these as well as numerous other aspects in reading the following disclosure.

BRIEF DESCRIPTION OF THE DRAWINGS

A further understanding of the nature and advantages the present disclosure may be realized by reference to the following drawings.

DETAILED DESCRIPTION

As noted above, disclosed herein are improved communication systems and methods for operating in a lightly-licensed, shared frequency spectrum (which may sometimes be referred to herein as a lightly-licensed frequency spectrum). For instance, the disclosed systems and methods relate to communication networks that provide broadband internet services to users and operate in a lightly-licensed frequency spectrum (e.g., the Citizen Broadcast Radio Service ("CBRS") spectrum).

Generally speaking, a communication link (e.g., a wireless mobile communication link between a cell tower and/or station (or small cell) and a mobile terminal, a fixed wireless communication link between a cell tower and/or station (or small cell) and customer premises equipment ("CPE")) may be bi-directional, where "uplink" refers to the flow of traffic from a client terminal (e.g., a mobile terminal or CPE) to a cell tower and/or station (or small cell) and "downlink" refers to the flow of traffic from the cell tower and/or station (or small cell) to the client terminal. As noted above, an uplink SLA is typically less stringent compared to a downlink SLA. For example, in a wireless broadband network, the minimum uplink throughput requirement may be 5-10 Mbps, whereas the minimum downlink throughput requirement may be 50-100 Mbps. However, in some instances, SLA requirements for a network may be the same for both uplink and downlink. In practice, the same antenna may be used in communication devices (e.g., a small cell) for both uplink and downlink. For example, for frequency division duplexing ("FDD"), separate frequencies are used for uplink and downlink but the same antenna may be used in parallel for reception and transmission, assuming there is enough frequency separation between uplink and downlink frequencies. As another example, for time division duplexing ("TDD"), the same frequency may be used for both uplink and downlink, but uplink and downlink operations may take place at different times using the same antenna (e.g., using the antenna for transmission at a given time and using the same antenna for reception at another given time). In this respect, for communication devices, the same antenna gain may be applicable for both uplink and downlink.

Figure 1:
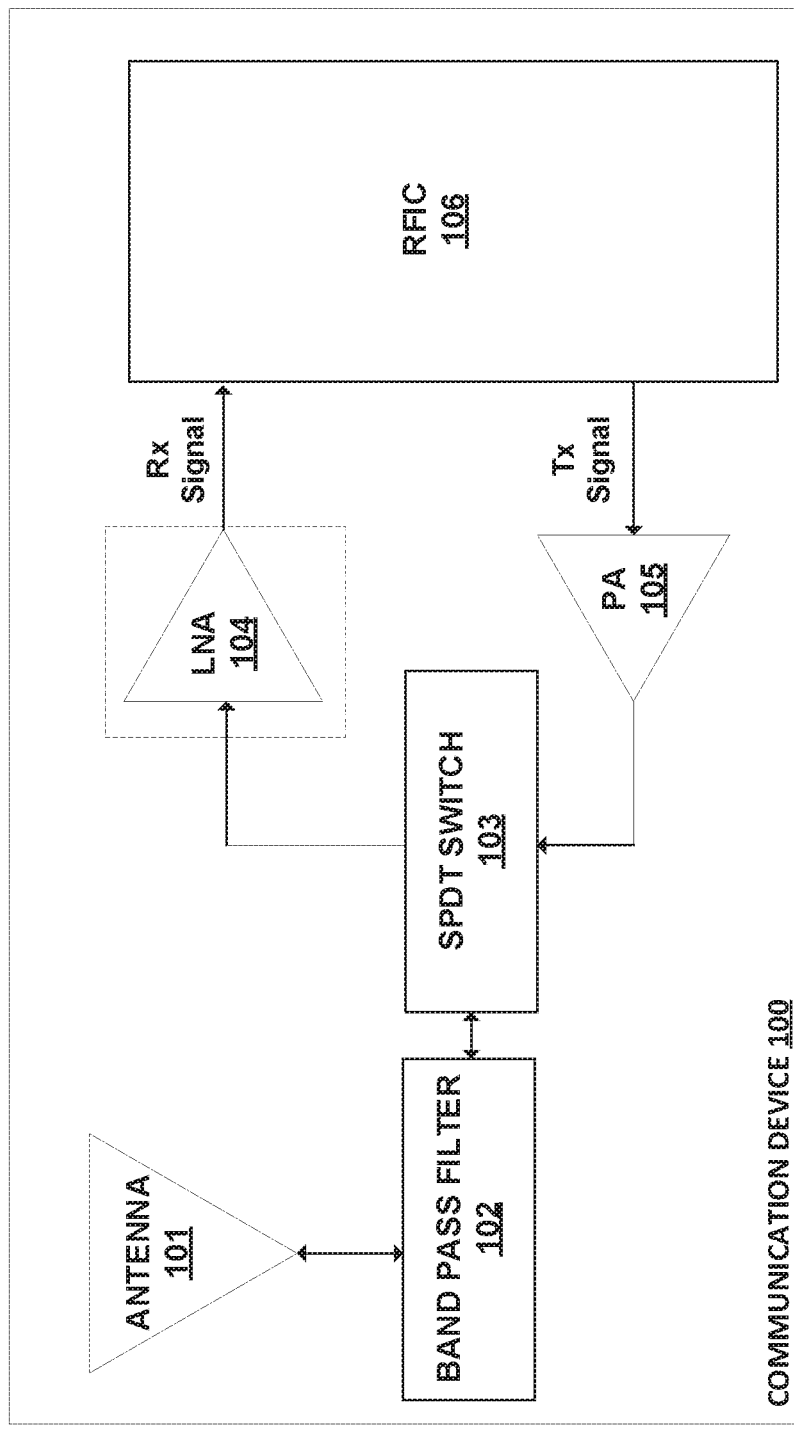
FIG. 1 depicts an example diagram of a communication device, in accordance with various aspects of this disclosure.

Referring to FIG. 1, a high-level block diagram of a communication device 100 that is capable of both transmission and reception of data is shown. Communication device 100 may comprise a small cell, among other possible communication devices. As shown, communication device 100 includes an antenna 101 that is coupled to a band pass filter 102. Antenna 101 may have a wide bandwidth and may be capable of receiving data over a wide range of a frequency spectrum, and band pass filter 102 may be used in a radio frequency ("RF") chain to remove unwanted signals in an undesired frequency spectrum. Similarly, in order to ensure that data transmission occurs within an authorized frequency spectrum, band pass filter 102 may remove any unwanted out-of-band signals and/or frequency components before any transmission over the air via antenna 101.

As further shown in FIG. 1, communication device 100 may include a Single Pole Double Throw ("SPDT") switch 103 that helps separate uplink and downlink signals. For instance, for TDD systems, during transmission, SPDT switch 103 may switch to the transmitter RF chain (which comprises antenna 101, band pass filter 102, SPDT switch 103, and power amplifier ("PA") 105) and facilitate carrying power amplified transmission signals from PA 105 to antenna 101 via band pass filter 102. During reception, SPDT switch 103 may switch to the receiver RF chain (which comprises antenna 101, band pass filter 102, SPDT switch 103, and low noise amplifier ("LNA") 104) and facilitate carrying the received signals from antenna 101 to a radio frequency integrated circuit ("RFIC") 106, which may in turn perform signal demodulation. In this respect, the same antenna (and hence the same antenna gain) of communication device 100 may be applicable for both uplink and downlink.

It should be understood that communication device 100 may include more or less components depicted in FIG. 1. For instance, LNA 104 may be an optional component, especially for small cells that have a conducted transmission power rating of less than 5 watts ("W"). Communication device 100 may take various other forms as well.

In practice, as noted above, downlink data originating from a cell tower and/or station that includes dedicated power supplies may have higher power levels, whereas uplink data that may originate from a client terminal (e.g., a mobile terminal) may be transmitted with low power levels and typically the total EIRP may be limited to 23 decibel-milliwatts ("dBm") due to cost and safety reasons. For certain client terminals, such as CPE, higher power may be used given that CPE are typically powered via a power line from a household or a building. However, an increase in transmit power beyond 23 dBm per 10 megahertz ("MHz") of a given frequency spectrum, especially in case of a lightly-licensed CBRS spectrum, may cause CPE to qualify as a category A or category B CBSD, which may result in a network operator paying unnecessary SAS fees. Accordingly, the network operator using a lightly-licensed spectrum (e.g., CBRS spectrum) typically has two options: (1) to operate with lower powered communication devices that may not meet an uplink SLA (especially at a cell edge) or may not be close to a cell tower and/or station or (2) to operate with higher powered communication devices that meet the required SLA but at the cost of higher operating expenses from SAS fee requirements.

Figure 2:
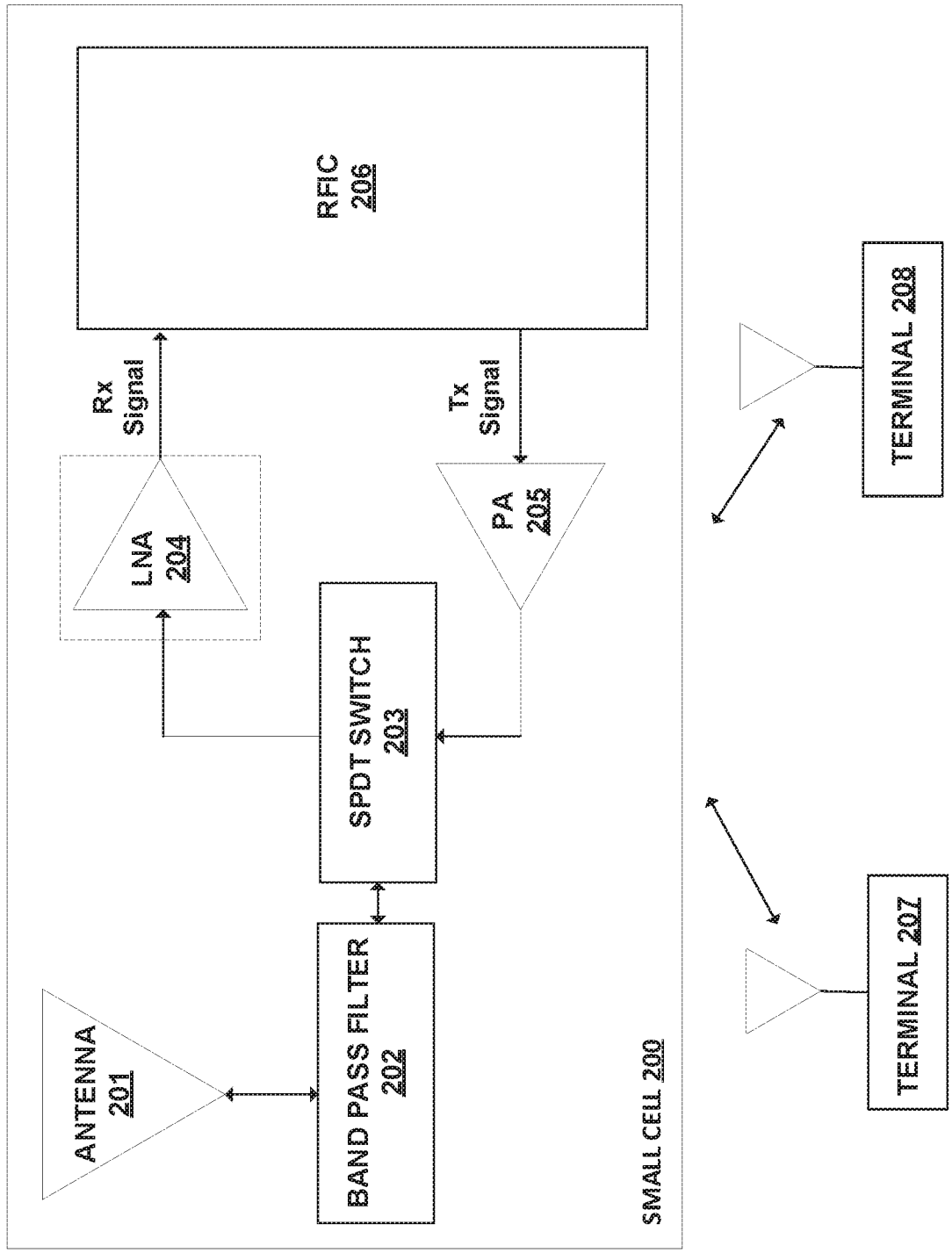
FIG. 2 depicts an example diagram related to a communication system, in accordance with various aspects of this disclosure.

Turning to FIG. 2, a high-level block diagram of an example small cell 200 is shown, where this small cell 200 may take a form that is similar to example communication device 100. For instance, similar to communication device 100, small cell 200 comprises antenna 201, band pass filter 202, SPDT switch 203, LNA 204, PA 205, and RFIC 206.

As further shown in FIG. 2, small cell 200 may establish bi-directional links with client terminal 207 that may comprise a mobile terminal or CPE and client terminal 208 that may comprise CPE. For purposes of illustration only, small cell 200 depicts only a few RF components in the receiver and transmitter RF chains, but one of ordinary skill in the art will appreciate that there can be additional components that may be required but are omitted for the sake of brevity.

In one embodiment, small cell 200 may operate in a lightly-licensed frequency spectrum, where a SAS (or other similar type of entity) may control the spectrum allocation dynamically and/or monitor for interference. As shown, small cell 201 may communicate with client terminal 207 (e.g., CPE or a mobile terminal) operating in the same lightly-licensed frequency spectrum and may have a certain maximum-transmit-power limitation that may vary depending on a given implementation. For example, the maximum-transmit-power limitation may be 23 dBm EIRP (including the antenna gain), higher or lower than 23 dBm EIRP, or can be the maximum-transmit-power limitation over a given bandwidth.

As further shown in FIG. 2, small cell 200 may also communicate with client terminal 208 (e.g., a CPE) operating in the same lightly-licensed frequency spectrum and may have a certain maximum-transmit-power limitation that is greater than the maximum-transmit-power limitation of a device category in which client terminal 207 belongs. In this respect, the maximum-transmit-power limitation of client terminal 208 may vary depending on the maximum-transmit-power limitation of client terminal 207. For example, the maximum-transmit-power limitation of client terminal 208 may be 30 dBm EIRP (including the antenna gain), higher or lower than 30 dBm EIRP, or can be the maximum-transmit-power limitation over a given bandwidth.

Because of the relatively-higher transmit power of client terminal 208 compared to client terminal 207, a desired uplink SLA can be met for the most part, but a network operator would likely have to pay SAS fees (e.g., on a monthly or yearly basis) due to a potentially larger coverage area compared to the coverage area of client terminal 207. In contrast, the network operator may reduce operating expenses from SAS fees by using client terminal 207, but uplink SLA requirements may not be met due to its relatively-lower power compared to client terminal 208.

One option to overcome this problem is to use a higher-gain antenna in small cell 200. However, a higher-gain antenna may not be feasible for multiple reasons. For example, in some cases, using a higher gain antenna at a small cell may increase the EIRP of the small cell and can move it from a lower-EIRP-category CBSD device to a higher-EIRP-category CBSD device. For instance, if a small cell has a total EIRP of 30 dBm per 10 Mhz, then increasing the antenna gain without changing the PA power will increase the total EIRP of the small cell beyond 30 dBm per 10 Mhz, and the network operator in such case may be subject to higher SAS fees. As another example, using a higher-gain antenna at a small cell may increase the size and weight of the small cell, increase the cost of the small cell, and/or change the design of the small cell's enclosure, which in some instances may violate federal, state, and/or local regulations.

In accordance with the present disclosure, uplink performance of a communication device (e.g., a small cell) can be improved without changing the EIRP profile or power class of the communication device by either introducing an LNA in the receiver RF chain of the communication device or modifying a given parameter of an existing LNA in the receiver RF chain (e.g., modifying the gain and/or noise figure of the existing LNA), such that the overall receiver sensitivity of the receiver RF chain is improved. Since the only change being made in the communication device is the LNA in the receiver RF chain (e.g., the gain and/or noise figure of LNA 204 of small cell 200), the EIRP of the communication device, which defines the power class of the communication device, remains the same. As a result, due to improved receiver sensitivity, a network operator may reduce or eliminate requirements for higher-EIRP-category client terminals (e.g., CPE) for its communication network, which may reduce operating expenses (e.g., from savings in SAS fees). Further, due to improved receiver sensitivity, lower-EIRP-category client terminals (e.g., CPE, a mobile terminal) may maintain their uplink SLA for the most part, and improve uplink user experience.

Figure 3:
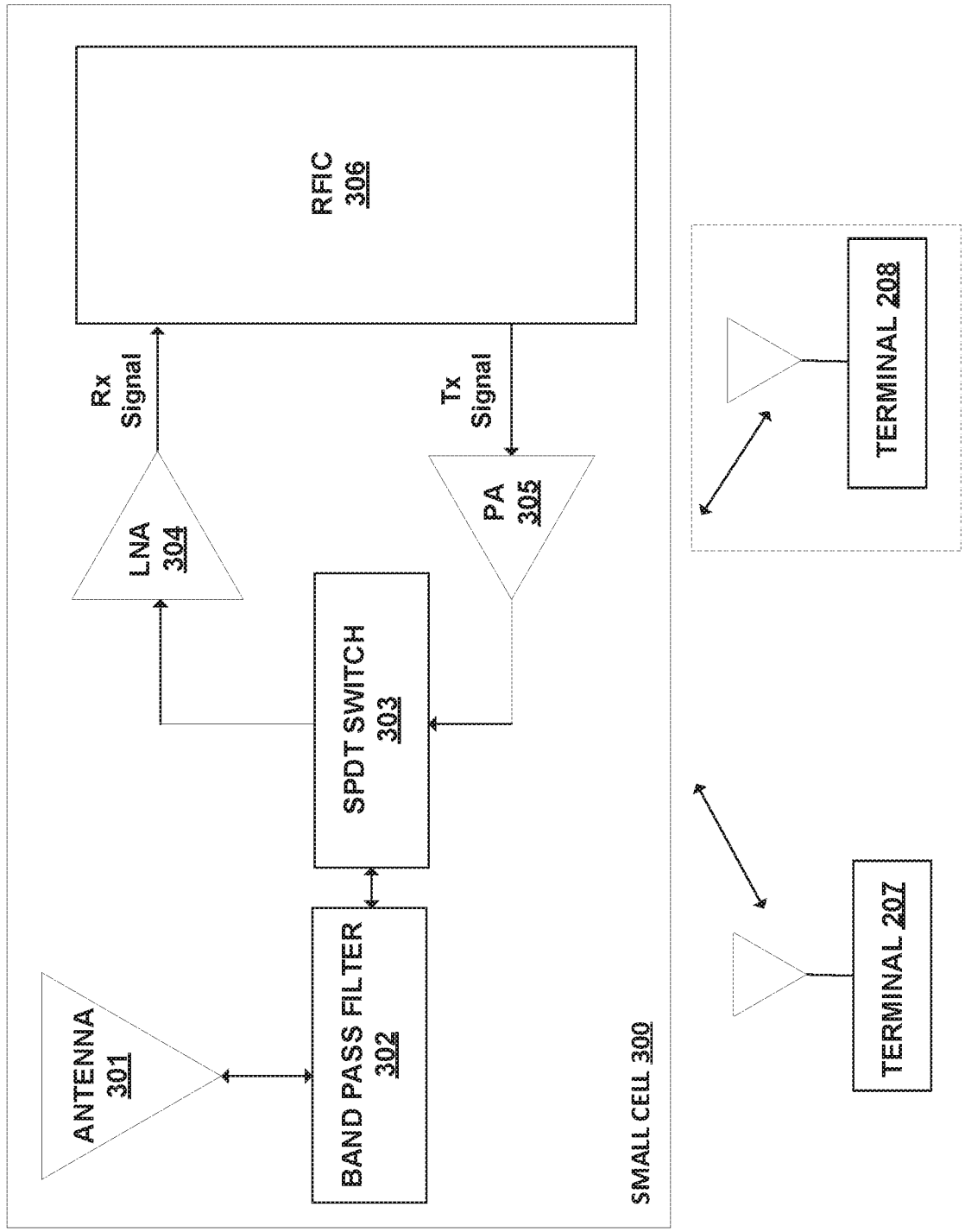
FIG. 3 depicts another example diagram related to a communication system, in accordance with various aspects of this disclosure.

Referring now to FIG. 3, a high-level block diagram of an improved small cell 300 operating in a lightly-licensed spectrum is shown. As shown, small cell 300 may take a form that is similar to example small cell 200 of FIG. 2 and example communication device 100 of FIG. 1, except that LNA 304 may be a required component of small cell 300 (whereas communication device 100 and/or small cell 200 may not necessarily include an LNA). In this respect, in instances where an LNA was not previously included in the receiver RF chain of small cell 300, LNA 304 may be introduced into the receiver RF chain of small cell 300. On the other hand, in instances where LNA 304 is already included in the receiver RF chain of small cell 300, the gain and/or noise figure of LNA 304 may be adjusted such that the overall receiver sensitivity of the RF receiver chain of small cell 300 is improved. As a result of introducing or modifying LNA 304 to improve the receiver sensitivity of small cell 300, communication device 307, which may use the lowest-EIRP-category of a lightly-licensed frequency spectrum (e.g., 23 dBm EIRP), can still meet an uplink SLA. Further, communication device 308, which may use a higher-EIRP-category (e.g., greater than 23 dBm EIRP), may no longer be needed to meet an uplink SLA due to the improvement in the receiver sensitivity of small cell 300.

Figure 4:
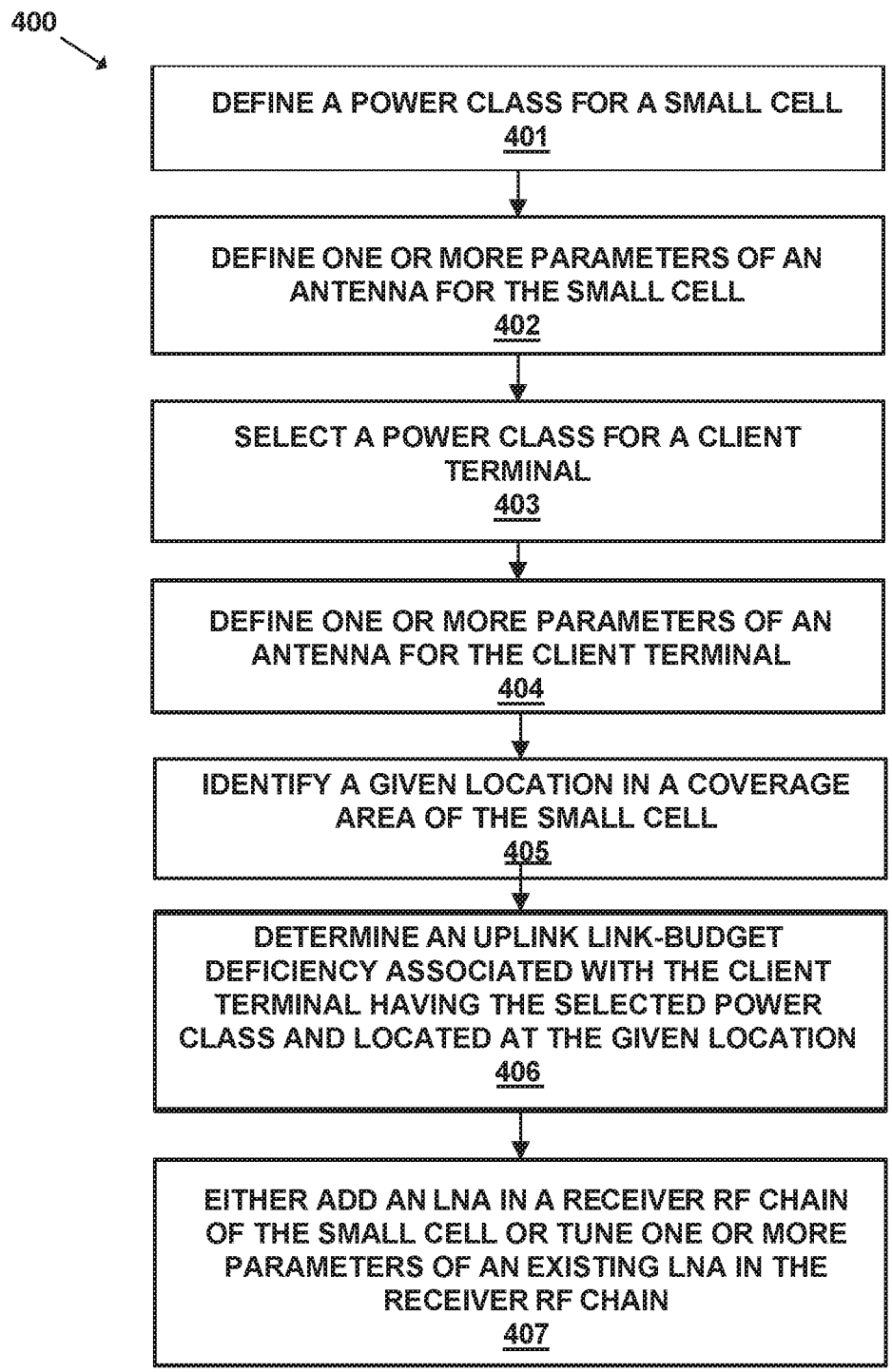
FIG. 4. depicts an example flow diagram, in accordance with various aspects of this disclosure.

Turning to FIG. 4, one possible example of the disclosed process for improving operations in a lightly-licensed frequency spectrum will now be described. In particular, FIG. 4 depicts an example flow diagram 400 for improving uplink coverage of a communication network without increasing the transmission power profile of communication devices in the communication network (e.g., a small cell, client terminal, or the like). In practice, each of the functions in flow diagram 400 may be implemented in whole or in part by a computing system, which may comprise a network interface, at least one processor, data storage, and program instructions stored in the data storage that are executable by the at least one processor to perform one or more of the functions described herein. Further, one of ordinary skill in the art will appreciate that such a computing system may carry out one or more of the functions described herein based on user input. Further yet, one of ordinary skill in the art will appreciate that flow diagram 400 is merely described in such a manner for the sake of clarity and explanation and that some functions may be carried out in various other manners as well, including the possibility that example functions may be added, removed, rearranged into different orders, grouped together, and/or not grouped together at all.

The disclosed process may begin with defining parameters for a transmitter RF chain of the small cell. For instance, with reference to FIG. 3, the disclosed process may begin with defining parameters for the transmitter RF chain of small cell 300, which may involve defining parameters for antenna 301 and/or PA 305. At block 401, a power class (e.g., an EIRP class) for a small cell (e.g., small cell 300) may be defined. Generally speaking, the power class for the small cell may represent a given EIRP class for the small cell that is available in the lightly-licensed frequency spectrum and can provide sufficient downlink coverage to meet a downlink SLA while keeping SAS fees to a minimum (thereby reducing operating expenses for a network operator). The power class for the small cell may be defined in various manners.

As one possibility, the power class for the small cell may be defined based on one or more of a theoretical analysis, a computer simulation (e.g., a computer program for performing signal propagation simulations), or field testing, among other possible techniques. For instance, a coverage area for the small cell (e.g., a geographical area within a 100 meter radius of the small cell) may be defined based on a variety of factors, examples of which may include demographics, capacity requirements, and/or population density, among other examples. Theoretical link budget analysis may then be utilized to determine an estimated power level required for the small cell based on the defined coverage area. In some cases, computer simulation may also be utilized to take the estimated power level required for the small cell and various geographical data associated with the defined coverage area as input and output a more refined power level required for the small cell. In turn, in some cases, field testing may be conducted to ensure that there is sufficient power throughout various locations in the defined coverage area for the small cell (e.g., the edge of the small cell).

The power class for the small cell may be defined in various other manners as well.

At block 402, one or more parameters of an antenna (e.g., antenna 301) for the small cell may be defined. For instance, an antenna gain of an antenna for the small cell may be defined. The antenna gain of the antenna for the small cell may be defined based on the defined power class for the small cell and perhaps one or more other factors, examples of which may include the size of the small cell enclosure (e.g., the maximum allowable dimensions of the small cell enclosure), the size of the antenna, design of the small cell enclosure, and/or federal, state, or local regulations on small cell enclosures, among other examples.

Based at least on the defined power class for the small cell at block 401 and the defined one or more parameters of the antenna (e.g., the antenna gain of the antenna) at block 402, a conducted power of a power amplifier (e.g., PA 305) for the small cell may also be defined. In one embodiment, the conducted power of the power amplifier may defined as the difference between the defined power class of the small cell and the antenna gain of the antenna.

After defining the parameters for the transmitter RF chain of the small cell, the disclosed process may involve defining parameters for a receiver RF chain of the small cell to improve uplink coverage of the communication network in accordance with the present disclosure. For instance, with reference to FIG. 3, the disclosed process may comprise defining parameters for the receiver RF chain of small cell 300, which may involve defining parameters for LNA 304.

At block 403, a power class (e.g., an EIRP class) for a client terminal (e.g., CPE, mobile terminal, etc.) may be selected. The power class for the client terminal may be selected in various manners.

As one possibility, the power class for the client terminal may be selected based on an EIRP class that is considered the most economical power class for client terminals with respect to SAS fees. As another possibility, the power class for the client terminal may be selected based on the lowest power class available for the client terminal in a lightly-licensed frequency spectrum (e.g., the CBRS spectrum). As yet another possibility, the power class for the client terminal may be selected based on a power class that is higher than the lowest power class available for the client terminal in the lightly-licensed frequency spectrum (e.g., the second lowest power class available for the client terminal). The power class that is higher than the lowest power class available for the client terminal (e.g., the second lowest power class available for the client terminal) may be selected because it may not be feasible to meet an uplink SLA with the lowest power class available for the client terminal even if the small cell (e.g., small cell 300) is designed in accordance with the techniques disclosed herein.

The power class for the client terminal may be selected in various other manners as well.

At block 404, one or more parameters of an antenna (e.g., antenna gain) for the client terminal (e.g., CPE, mobile terminal, etc.) may be defined based on various factors similar to the factors described above with reference to block 402.

At block 405, a given location in the coverage area of the small cell (e.g., small cell 300) may be identified. For instance, a given location in the coverage area that is expected to have a signal strength that is at or near the lowest signal strength within the coverage area of the small cell may be identified. In some instances, this given location may be at or near an edge (e.g., a boundary) of the coverage area. However, it should be understood that this given location could be at a different location within the coverage area of the small cell as well.

At block 406, an uplink link-budget deficiency associated with the client terminal having the selected power class and located at the given location of the coverage area of the small cell may be determined. The uplink link-budget deficiency may be determined in various manners.

As one possibility, the uplink link-budget deficiency may be determined based on one or more of a theoretical link budget analysis, empirical analysis of field measurement data, and/or computer simulation of the uplink RF coverage and throughput in the communication network. For instance, one or more of the foregoing analysis techniques may be utilized to determine an expected uplink throughput (e.g., an expected uplink peak throughput) that may be attained when data is transmitted from the client terminal having the selected power class and located at the given location of the coverage area of the small cell (e.g., an edge of the coverage area or some other location that is expected to have the lowest signal strength). The expected uplink throughput may then be compared with the desired uplink throughput (e.g., the uplink throughput that meets an uplink SLA) in order to determine the uplink link-budget deficiency. In this respect, the uplink link-budget deficiency may represent the difference between the desired uplink throughput (that is in accordance with the uplink SLA) and the expected uplink throughput.

At block 407, either an LNA may be added in the receiver RF chain of the small cell (in instances where the small cell does not comprise an LNA) or one or more parameters of an existing LNA may be tuned (in instances where the small cell does comprise an LNA), such that the overall receiver sensitivity of the small cell may be improved. For example, LNA 304 in the receiver RF chain of small cell 300 may be tuned by adjusting the gain and/or noise figure of LNA 304, such that the overall receiver sensitivity of the receiver RF chain is improved by at least the determined uplink link-budget deficiency. By adding an LNA or tuning one or more parameters of an LNA (e.g., the gain and/or noise figure of LNA 304) in the receiver RF chain of the small cell, the small cell EIRP profile may stay the same, since the LNA can increase the overall receiver sensitivity of the small cell without increasing the radiated power of communication signals that are exchanged over the air between the small cell and a client terminal (e.g., CPE or mobile terminal). As a result, there may be no additional operating expenses related to SAS fees for the network operator. Further, due to the improved receiver sensitivity of the small cell, a client terminal with the lowest power profile may meet the uplink SLA.

It should be understood that while example flow diagram 400 of FIG. 4 has been described with respect to improving uplink coverage in a lightly-licensed frequency, shared frequency spectrum with two or three EIRP classes, more or less EIRP classes may be involved in other embodiments.

Example embodiments of the disclosed innovations have been described above. Those skilled in the art will understand, however, that changes and modifications may be made to the embodiments described without departing from the true scope and spirit of the present invention, which will be defined by claims.

Further, to the extent that examples described herein involve operations performed or initiated by actors, such as humans, operators, users or other entities, this is for purposes of example and explanation only. Claims should not be construed as requiring action by such actors unless explicitly recited in claim language.

What is claimed is:

1. A small cell having a coverage area, the small cell comprising:
   a radio frequency integrated circuit (RFIC);
   a switch configured to separate uplink signals and downlink signals;
   an antenna configured to send uplink signals to the switch and receive downlink signals from the switch;
   a power amplifier configured to receive a downlink signal from the RFIC and send the downlink signal to the switch; and
   a low noise amplifier (LNA) configured to receive an uplink signal from the switch and send the uplink signal to the RFIC;
   wherein a receiver RF chain of the small cell is defined by an interconnection between the antenna, the switch, the LNA, and the RFIC;
   wherein a transmitter RF chain of the small cell is defined by an interconnection between the RFIC, the power amplifier, the switch, and the antenna; and
   wherein the LNA has at least one parameter that is defined based on a determined uplink link-budget deficiency associated with a client terminal having a given power class and located at a given location of the coverage area.

2. The small cell of claim 1, wherein the client terminal comprises customer premises equipment (CPE) or a mobile terminal.

3. The small cell of claim 1, wherein the given power class comprises a lowest available power class for client terminals.

4. The small cell of claim 1, wherein the given location of the coverage area comprises an edge of the coverage area.

5. The small cell of claim 1, wherein the antenna has an antenna gain that is defined based on a defined power class for the small cell and one or more of (1) a size of an enclosure of the small cell, (2) a size of the antenna, (3) a design of the enclosure of the small cell, or (4) a federal, state, or local regulation.

6. The small cell of claim 1, further comprising:
one or more filters configured to remove signals that are outside of a frequency spectrum in which the small cell is configured to operate,
wherein the one or more filters are interconnected between the antenna and the switch.

7. The small cell of claim 6, wherein the one or more filters comprises a band pass filter.

8. The small cell of claim 1, wherein the small cell is configured to operate in a lightly-licensed frequency spectrum between 3550 MHz and 3700 MHz.

9. The small cell of claim 1, wherein the switch comprises a Single Pole Double Throw (SPDT) switch.

10. The small cell of claim 1, wherein the at least one parameter of the LNA comprises a gain of the LNA or a noise figure of the LNA.

11. The small cell of claim 1, wherein the given power class comprises an equivalent isotopically radiated power (EIRP) class.

12. The small cell of claim 1, wherein the uplink link-budget deficiency comprises a difference between an uplink throughput that meets an uplink Service Level Agreement (SLA) and an expected uplink throughput associated with the client terminal.

13. A communication system comprising:
one or more client terminals; and
a small cell having a coverage area that is communicatively coupled to the one or more client terminals, the small cell comprising:
a radio frequency integrated circuit (RFIC);
a switch configured to separate uplink signals and downlink signals;
an antenna configured to send uplink signals to the switch and receive downlink signals from the switch;
a power amplifier configured to receive a downlink signal from the RFIC and send the downlink signal to the switch; and
a low noise amplifier (LNA) configured to receive an uplink signal from the switch and send the uplink signal to the RFIC;
wherein a receiver RF chain of the small cell is defined by an interconnection between the antenna, the switch, the LNA, and the RFIC;
wherein a transmitter RF chain of the small cell is defined by an interconnection between the RFIC, the power amplifier, the switch, and the antenna; and
wherein the LNA has at least one parameter that is defined based on a determined uplink link-budget deficiency associated with a given client terminal having a given power class and located at a given location of the coverage area.

14. The communication system of claim 13, wherein the one or more client terminals comprises customer premises equipment (CPE) or one or more mobile terminal.

15. The communication system of claim 13, wherein the given power class comprises a lowest equivalent isotopically radiated power (EIRP) class available for the given client terminal.

16. The communication system of claim 13, wherein the given location of the coverage area comprises an edge of the coverage area.

17. The communication system of claim 13, wherein the antenna has an antenna gain that is defined based on a defined power class for the small cell and one or more of (1) a size of an enclosure of the small cell, (2) a size of the antenna, (3) a design of the enclosure of the small cell, or (4) a federal, state, or local regulation.

18. The communication system of claim 13, further comprising:
one or more filters configured to remove signals that are outside of a frequency spectrum in which the small cell is configured to operate,
wherein the one or more filters comprises a band pass filter, and
wherein the one or more filters are interconnected between the antenna and the switch.

19. The communication system of claim 13, wherein the at least one parameter of the LNA comprises a gain of the LNA or a noise figure of the LNA.

20. A method for defining parameters for a small cell that comprises (i) a radio frequency integrated circuit (RFIC), (ii) a switch configured to separate uplink signals and downlink signals, (iii) an antenna configured to send uplink signals to the switch and receive downlink signals from the switch, (iv) a power amplifier configured to receive a downlink signal from the RFIC and send the downlink signal to the switch, and (v) a low noise amplifier (LNA) configured to receive an uplink signal from the switch and send the uplink signal to the RFIC, the method comprising:
defining a power class for the small cell;
based at least on the defined power class for the small cell, defining an antenna gain for the antenna of the small cell;
determining an uplink link-budget deficiency associated with a client terminal having a given power class and located at a given location of a coverage area of the small cell; and
based on the determined uplink link-budget deficiency, defining one or more parameters of the LNA of the small cell.

* * * * *